US012620966B2

(12) United States Patent
Wang et al.

(10) Patent No.: US 12,620,966 B2
(45) Date of Patent: May 5, 2026

(54) SOLIDLY MOUNTED RESONATOR

(71) Applicant: Epicmems (Xiamen) Co., Ltd., Fujian (CN)

(72) Inventors: Wei Wang, Fujian (CN); Jinming Yang, Fujian (CN); Ping Li, Fujian (CN); Jiang Jiang, Fujian (CN); Bohua Peng, Fujian (CN); Nianchu Hu, Fujian (CN); Bin Jia, Fujian (CN)

(73) Assignee: Epicmems (Xiamen) Co., Ltd., Fujian (CN)

( * ) Notice: Subject to any disclaimer, the term of this patent is extended or adjusted under 35 U.S.C. 154(b) by 759 days.

(21) Appl. No.: 17/906,392

(22) PCT Filed: Mar. 18, 2020

(86) PCT No.: PCT/CN2020/079973
§ 371 (c)(1),
(2) Date: Sep. 15, 2022

(87) PCT Pub. No.: WO2021/184252
PCT Pub. Date: Sep. 23, 2021

(65) Prior Publication Data
US 2023/0124437 A1     Apr. 20, 2023

(51) Int. Cl.
*H03H 9/17* (2006.01)
*H03H 3/04* (2006.01)
(Continued)

(52) U.S. Cl.
CPC .............. *H03H 9/175* (2013.01); *H03H 3/04* (2013.01); *H03H 9/132* (2013.01); *H03H 9/17* (2013.01);
(Continued)

(58) Field of Classification Search
CPC .......... H03H 9/175; H03H 9/17; H03H 9/132; H03H 3/04; H03H 2003/0457; H03H 2003/025; H03H 9/02118
See application file for complete search history.

(56) References Cited

U.S. PATENT DOCUMENTS 7,173,361 B2    2/2007   Saito et al.
7,369,013 B2    5/2008   Fazzio et al.
(Continued)

FOREIGN PATENT DOCUMENTS

CN          1638271 A      7/2005
CN          1845453 A      10/2006
(Continued)

OTHER PUBLICATIONS

López et al, "A Solidly Mounted Resonator With CMOS-Fabricated Acoustic Mirror For Low-Cost Air Quality Monitoring," 2019 20th International Conference on Solid-State Sensors, Actuators and Microsystems & Eurosensors XXXIII (Transducers & Eurosensors XXXIII), Berlin, Germany, 2019, pp. 1242-1245. (Year: 2019).*
PCT International Search Report for PCT Application No. PCT/CN2020/079973 mailed Nov. 26, 2020 (5 pages, with English translation).
(Continued)

*Primary Examiner* — A. Dexter Tugbang
(74) *Attorney, Agent, or Firm* — Merchant & Gould P.C.

(57) ABSTRACT

Provided are a solidly mounted resonator and a method for preparing a solidly mounted resonator. The solidly mounted resonator includes: a piezoelectric structure, wherein the piezoelectric structure includes: an upper electrode layer, a lower electrode layer and a piezoelectric layer. The lower electrode layer disposed corresponding to the piezoelectric structure, and the lower electrode layer includes: a protruding portion protruding downward corresponding to a lower surface of the lower electrode layer; the piezoelectric layer
(Continued)

is disposed on an upper surface of the lower electrode layer; the upper electrode layer is disposed on an upper surface of the piezoelectric layer.

6 Claims, 5 Drawing Sheets

(51) Int. Cl.
  *H03H 9/13*      (2006.01)
  *H03H 9/02*      (2006.01)

(52) U.S. Cl.
  CPC . *H03H 2003/0457* (2013.01); *H03H 9/02118* (2013.01)

(56) References Cited

U.S. PATENT DOCUMENTS

| | | | |
|---|---|---|---|
| 9,742,377 | B2 | 8/2017 | Iwaki et al. |
| 2014/0292150 | A1* | 10/2014 | Zou ........................ H03H 9/175 |
| | | | 310/346 |
| 2017/0261503 | A1* | 9/2017 | Murdock ............... H03H 9/175 |

FOREIGN PATENT DOCUMENTS

| | | | |
|---|---|---|---|
| CN | 105099391 A | | 11/2015 |
| CN | 111294011 A | | 6/2020 |
| JP | 2018117194 A | * | 7/2018 |

OTHER PUBLICATIONS

PCT Written Opinion for PCT Application No. PCT/CN2020/079973 mailed Nov. 26, 2020 (4 pages).

* cited by examiner

S310 — Forming a laminated structure

S320 — Forming a lower electrode layer of a piezoelectric structure on the laminated structure; wherein the lower electrode layer comprises: a protruding portion protruding downward corresponding to a lower surface of the lower electrode layer

SOLIDLY MOUNTED RESONATOR

CROSS-REFERENCE TO RELATED APPLICATIONS

This application is a U.S. National Stage Application of PCT/CN2020/079973, filed 18 Mar. 2020, and which application is incorporated herein by reference. To the extent appropriate, a claim of priority is made to the above disclosed application.

TECHNICAL FIELD

The present disclosure relates to a field of resonator technology, and in particular, to a solidly mounted resonator and a method for preparing a solidly mounted resonator.

BACKGROUND

Solidly Mounted Resonator (SMR for short) is a device that includes a Bragg reflector structure and a piezoelectric structure. In an application of a conventional solidly mounted resonator, the piezoelectric structure is formed on the Bragg reflector structure. The Bragg reflector is formed by alternating high and low acoustic impedance materials. The piezoelectric structure is composed of upper and lower electrode layers sandwiching piezoelectric materials. A piezoelectric material may be grown on an upper surface of a lower electrode to form a piezoelectric layer. Therefore, in the related art, a lower electrode pattern is usually etched first and then a piezoelectric layer is deposited, so that the piezoelectric layer may be grown on a surface of an uneven lower electrode, and a lattice structure and lattice orientation of the piezoelectric layer may be deteriorated in an uneven place, thereby affecting a piezoelectric effect and affecting a device performance.

SUMMARY

One aspect of the present disclosure provides a solidly mounted resonator, including: a piezoelectric structure, wherein the piezoelectric structure includes: a lower electrode layer, a piezoelectric layer, and an upper electrode layer. The lower electrode layer is disposed corresponding to a lower portion of the piezoelectric structure, and the lower electrode layer includes: a protruding portion protruding downward corresponding to a lower surface of the lower electrode layer; the piezoelectric layer is disposed on an upper surface of the lower electrode layer; and the upper electrode layer is disposed on an upper surface of the piezoelectric layer.

According to the embodiments of the present disclosure, the protruding portion includes: a first protruding portion and a second protruding portion. The first protruding portion protrudes downward corresponding to an edge of the lower surface of the lower electrode layer; the second protruding portion protrudes downward corresponding to a middle portion of the lower surface of the lower electrode layer.

According to the embodiments of the present disclosure, the first protruding portion is an annular closed structure; a distance between an inner edge of the first protruding portion and an outer edge of the second protruding portion is a first distance a; a protruding distance of the first protruding portion relative to the lower surface of the lower electrode layer is a second distance b; a protruding distance of the second protruding portion relative to the lower surface of the lower electrode layer is a third distance c; wherein b>c.

According to the embodiments of the present disclosure, the upper surface of the lower electrode layer is a planarization surface; materials of the upper electrode layer and the lower electrode layer are combinations of one or more materials selected from molybdenum Mo, titanium Ti, tungsten W, gold Au, aluminum Al, and platinum Pt; and a material of the piezoelectric layer is aluminum nitride AlN, zinc oxide ZnO or lead zirconate titanate PZT.

According to the embodiments of the present disclosure, the solidly mounted resonator includes: a substrate layer and a laminated structure. The substrate layer is disposed below the piezoelectric structure, and the laminated structure is disposed between the piezoelectric structure and the substrate layer, wherein the laminated structure sequentially comprises: a first low acoustic impedance layer, a first high acoustic impedance layer, a second low acoustic impedance layer, a second high acoustic impedance layer, and a third low acoustic impedance layer from bottom to top, wherein the third low acoustic impedance layer is disposed below the piezoelectric layer of the piezoelectric structure.

According to the embodiments of the present disclosure, the third low acoustic impedance layer includes: a lower electrode slot recessed downward relative to an upper surface of the third low acoustic impedance layer, and the lower electrode slot includes: a first groove recessed downward corresponding to an edge of a bottom surface of the lower electrode slot; and a second groove recessed downward corresponding to a middle portion of the bottom surface of the lower electrode slot.

According to the embodiments of the present disclosure, the first groove is a closed annular slot; a distance between an inner edge of the first groove and an outer edge of the second groove is a first distance a; a concave distance of the first groove relative to the bottom surface of the lower electrode slot is a second distance b; a concave distance of the second groove relative to the bottom surface of the lower electrode slot is a third distance c; wherein b>c.

According to the embodiments of the present disclosure, a material of the substrate layer is a combination of one or more materials selected from silicon, glass, sapphire, and ceramics; materials of the first low acoustic impedance layer, the second low acoustic impedance layer and the third low acoustic impedance layer are siloxane or silicon dioxide; and materials of the first high acoustic impedance layer and the second high acoustic impedance layer are tungsten or molybdenum.

Another aspect of the present disclosure provides a method for preparing the above-mentioned solidly mounted resonator, including: forming a laminated structure, and forming a lower electrode layer of a piezoelectric structure on the laminated structure; wherein the lower electrode layer includes: a protruding portion protruding downward corresponding to a lower surface of the lower electrode layer.

According to the embodiments of the present disclosure, the forming a laminated structure includes: sequentially forming a first low acoustic impedance layer, a first high acoustic impedance layer, a second low acoustic impedance layer, a second high acoustic impedance layer and a third low acoustic impedance layer on the substrate layer from bottom to top.

According to the embodiments of the present disclosure, the forming a piezoelectric structure on the laminated structure includes: forming a lower electrode slot recessed downward on an upper surface of the third low acoustic impedance layer; wherein a first groove recessed downward is formed corresponding to an edge of a bottom surface of the lower electrode slot; and a second groove recessed downward is formed corresponding to a middle portion of the bottom surface of the lower electrode slot.

According to the embodiments of the present disclosure, the forming a lower electrode layer of a piezoelectric structure on the laminated structure includes: forming the lower electrode layer in the lower electrode slot based on the first groove and the second groove; wherein a first protruding portion of the protruding portion is formed corresponding to the first groove; and a second protruding portion of the protruding portion is formed corresponding to the second groove.

According to the embodiments of the present disclosure, the forming a lower electrode layer of a piezoelectric structure on the laminated structure further includes: performing a planarization process on the lower electrode layer and the third low acoustic impedance layer, wherein an upper surface of the lower electrode layer is a planarization surface, and the planarization surface is flush with the upper surface of the third low acoustic impedance layer.

According to the embodiments of the present disclosure, the preparation method further includes: forming a piezoelectric layer of the piezoelectric structure corresponding to the planarization surface of the lower electrode layer and the upper surface of the third low acoustic impedance layer; and forming an upper electrode layer of the piezoelectric structure on an upper surface of the piezoelectric layer.

DETAILED DESCRIPTION OF EMBODIMENTS

In order to make the objectives, technical solutions and advantages of the present disclosure clearer, the present disclosure will be further described in detail below with reference to the specific embodiments and the accompanying drawings.

In the related art, a lower electrode pattern is first etched and then a piezoelectric layer is deposited, so that the piezoelectric layer may be grown on a surface of an uneven lower electrode so as to affect a device performance. In order to solve this problem, the present disclosure provides a solidly mounted resonator and a method for preparing a solidly mounted resonator.

Figure 1:
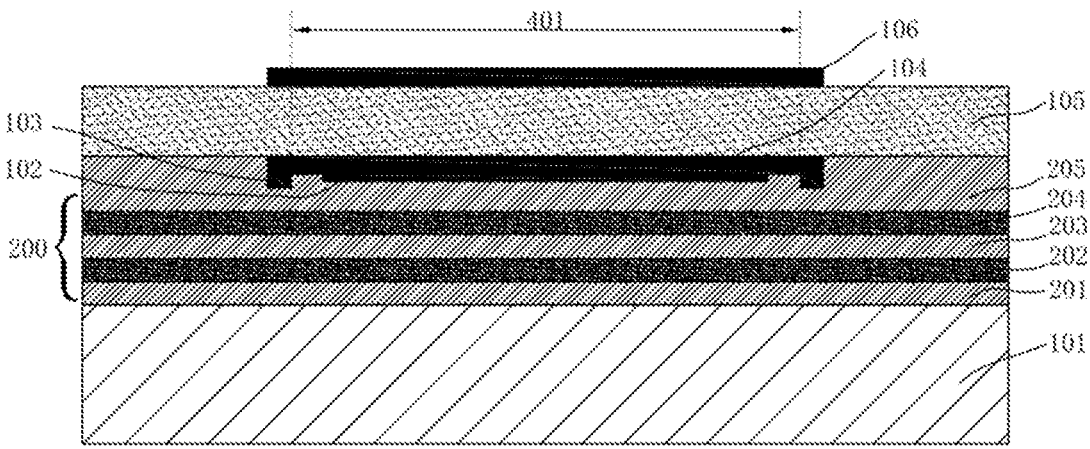
FIG. 1 schematically shows a cross-sectional view of a solidly mounted resonator according to the embodiments of the present disclosure.
Figure 2A:
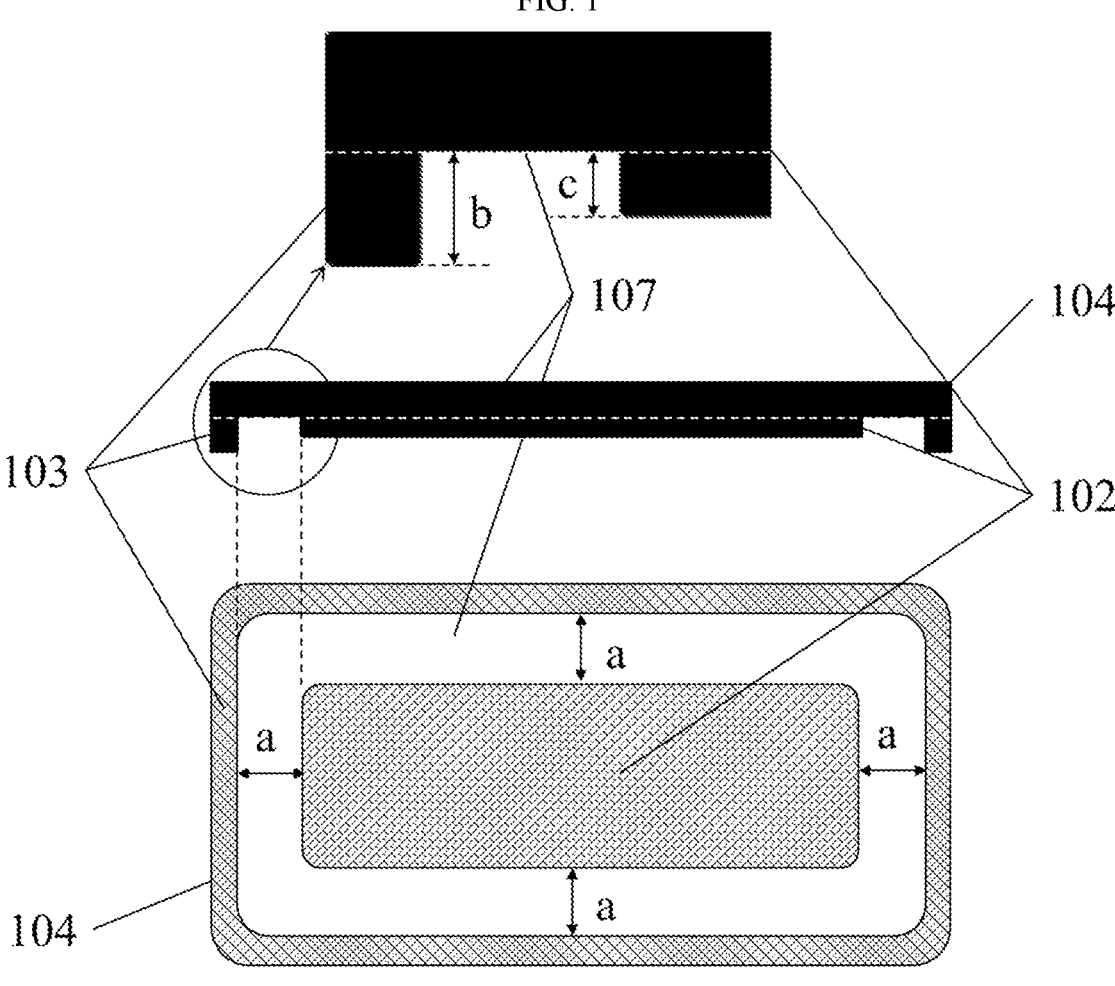
FIG. 2A schematically shows a structural cross-sectional view and a plan view of a lower electrode layer according to the embodiments of the present disclosure.
Figure 2B:
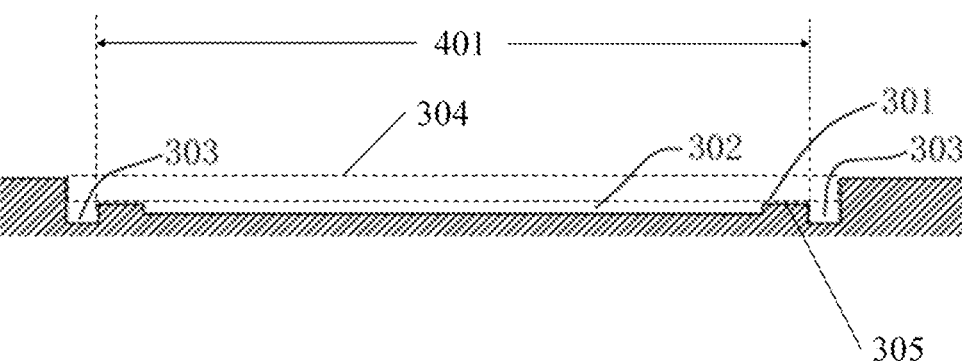
FIG. 2B schematically shows a structural cross-sectional view of a lower electrode slot according to the embodiments of the present disclosure.

An aspect of the present disclosure provides a solidly mounted resonator, as shown in FIG. 1 to FIG. 2B, including: a piezoelectric structure which plays a piezoelectric effect. The piezoelectric structure includes: an upper electrode layer 106, a lower electrode layer 104 and a piezoelectric layer 105. The lower electrode layer 104 is disposed corresponding to a lower portion of the piezoelectric structure. Specifically, the lower electrode layer 104 may be a composition structure of a lower portion of the piezoelectric structure, which is disposed below the piezoelectric layer 105 and serves as a lower electrode of the piezoelectric structure. According to the embodiments of the present disclosure, the lower electrode layer 104 includes a protruding portion protruding downward corresponding to a lower surface of the lower electrode layer 104. The lower electrode layer 104 includes a protruding portion and an electrode body 107 (as shown in FIG. 2A). The lower surface of the above-mentioned lower electrode layer 104 may be a lower surface of the electrode body 107. At the same time, the protruding portion protrudes downward relative to the lower surface, so that a lower electrode pattern required by the piezoelectric structure may be formed on the lower surface of the lower electrode layer 104, which is used to generate a piezoelectric effect of the piezoelectric structure.

According to the embodiments of the present disclosure, the piezoelectric layer 105 is disposed on an upper surface of the lower electrode layer 104 and is used to generate a piezoelectric effect; the piezoelectric layer 105 is disposed on the upper surface of the lower electrode layer 104, and a lower surface of the piezoelectric layer 105 is in contact with the upper surface (i.e., an upper surface of the electrode body 107, as shown in FIG. 2A) of the lower electrode layer 104, and the piezoelectric layer 105 is used to play a piezoelectric effect under a cooperation of the upper electrode layer 106 and the lower electrode layer 104. The upper electrode layer 106 is disposed on an upper surface of the piezoelectric layer 105 and serves as a lead-out electrode of the device.

In the solidly mounted resonator of the present disclosure, a quality factor Q is determined by a material loss of the piezoelectric layer, and the lower the energy loss, the higher the Q value. By forming a protruding structure on the lower surface of the lower electrode layer 104, the upper surface of the lower electrode layer 104 or an upper surface of the upper electrode 106 does not need to form the above-mentioned protruding structure, the upper surface (i.e., an upper surface of the electrode body 107, as shown in FIG. 2A) of the lower electrode layer 104 may form a flat surface, so that the piezoelectric layer 105 of the piezoelectric structure may be grown on the upper surface of the flat lower electrode layer 104, that is, the lower surface of the piezoelectric layer 105 in contact with the upper surface of the lower electrode layer 104 is also a planarization surface, which is more beneficial to acquire a crystal structure in which a growth crystal phase tends to be c-axis orientation between the upper electrode layer 106 and the lower electrode layer 104, thereby improving a piezoelectric performance of the piezoelectric layer 105 and improving a performance (an improvement of the Q value) of the solidly mounted resonator of the present disclosure.

Based on the structure of the above-mentioned solidly mounted resonator, the present disclosure may produce an unexpected technical effect: a patterned protruding structure of the lower electrode layer 104 of the present disclosure may be formed on the lower surface of the lower electrode by a metal deposition method, which is simpler than a conventional method of directly forming a protruding structure on the upper surface of the lower electrode layer 104 or the upper surface of the upper electrode 106 by a metal etching method. Specifically, since a conventional protruding structure is formed on the upper surface of the upper electrode layer 106 or the lower electrode layer 104, at least two steps of etching are required to etch the surface. In addition, due to metal characteristics (for example, a metal etching selectivity is relatively poor) of the electrode layer, during an etching process of the protruding structure pattern on the process, a metal over-etching of the metal electrode layer is very likely to occur, and a control of an etching depth is also difficult. Therefore, the use of the structure of the solidly mounted resonator of the present disclosure may not only prevent a problem of metal over-etching and effectively improve a preparation yield of the device, but also avoid multiple etchings, reduce formation steps of an electrode layer protruding portion, and may also effectively control a thickness variation of the electrode layer. According to the embodiments of the present disclosure, the above-mentioned electrode layer may include the upper electrode layer 106 and/or the lower electrode layer 104.

Finally, through the structure of the solidly mounted resonator of the present disclosure, another unexpected technical effect may be further produced: according to the embodiments of the present disclosure, an electrode slot may be formed in a laminated structure below the piezoelectric structure for embedding the lower electrode layer in the electrode slot of the laminated structure. Therefore, the present disclosure may also reduce a thickness of the device structure and further reduce a size of the device structure on the basis of the above effects.

According to the embodiments of the present disclosure, as shown in FIG. 1 and FIG. 2A, the solidly mounted resonator of the present disclosure further includes an electrode body 107. In addition to a corresponding piezoelectric effect in the piezoelectric structure, the electrode body 107 may also be used to provide setting positions for the above-mentioned protruding portions (e.g., the below-mentioned first protruding portion 103 and second protruding portion 102).

According to the embodiments of the present disclosure, as shown in FIG. 1 and FIG. 2A, the protruding portion includes: a first protruding portion 103 and a second protruding portion 102. The first protruding portion 103 protrudes downward corresponding to an edge of the lower surface of the lower electrode layer 104; specifically, the first protruding portion 103 protrudes downward relative to the lower surface of the electrode body 107 of the lower electrode layer 104 to generate an impedance mismatch at a periphery of the resonator. Therefore, a bulk acoustic wave energy generated by the device is confined inside the protruding structure of the lower electrode layer 104 of the piezoelectric structure, so that the bulk acoustic wave energy may be less likely to leak, the energy loss may be reduced, and a Q value of the device may be improved.

The second protruding portion 102 protrudes downward corresponding to a middle portion of the lower surface of the lower electrode layer 104. Specifically, the second protruding portion 102 protrudes downward relative to the lower surface of the electrode body 107 of the lower electrode layer 104, has a protruding height smaller than that of the first protruding portion, and is used to form a pit between the first protruding portion and the second protruding portion. The pit may effectively reduce a parasitic resonance of a lateral mode below a cutoff frequency, and also help to improve a Q value of the resonator, as shown in FIG. 1 and FIG. 2A.

Based on the structures of the above-mentioned first protruding portion 103 and second protruding portion 102, the present disclosure may produce another unexpected technical effect: an energy loss of the solidly mounted resonator mainly comes from a lateral mode of the device structure, so that a leakage of a bulk acoustic wave energy occurs at an edge of the structure. In a process of forming the lower electrode layer 104 or forming the protruding portion structure on the upper surface of the lower electrode, the surface needs to be etched, so that edges of the lower electrode layer and the protruding portion of the pattern are repeatedly exposed to various dry and wet methods, resulting in a poor edge quality and contour shape of the lower electrode layer and the protruding portion of the pattern, which is very easy to cause a leakage of the bulk acoustic wave energy. Compared with a conventional method of directly forming on the upper surface of the lower electrode layer 104 by etching, the first protruding portions 103 and the second protruding portions 102 of the lower electrode layer 104 of the present disclosure may be formed in one step by a metal deposition method. The use of the structure of the solidly mounted resonator of the present disclosure may effectively ensure that edges of the lower electrode layer 104, the first protruding portion 103 and the second protruding portion 102 will not be degraded in edge quality and contour shape, and further prevent a leakage of a bulk acoustic wave energy, play a more obvious role of acoustic impedance mismatch, and may effectively prevent an energy loss caused by a lateral mode of the device structure. Therefore, the device may have a better piezoelectric effect, an Rp value may be further improved, and a negative impact of a lateral mode parasitic resonance below a cutoff frequency on a device performance may also be improved. In addition, the effect of preventing a metal electrode from being over-etched, simplifying process steps, etc. may also be achieved, which will not be repeated here.

According to the embodiments of the present disclosure, as shown in FIG. 2A, the first protruding portion 103 is an annular closed structure; a distance between an inner edge of the first protruding portion 103 and an outer edge of the second protruding portion 102 is a first distance a; when the first protruding portion 103 is an annular closed protruding structure, the inner edge of the first protruding portion 103 is relative to the second protruding portion surrounding a middle portion of the lower surface of the electrode body 107, that is, an edge of the first protruding portion 103 facing the second protruding portion 102 is an inner edge, and an edge of the first protruding portion 103 facing away from the second protruding portion 102 is an outer edge. A protruding distance of the first protruding portion 103 relative to the lower surface of the lower electrode layer 104 is a second distance b, which is used to prevent a side leakage of a bulk acoustic wave energy of the device structure and reduce an energy loss; a protruding distance of the second protruding portion 102 relative to the lower surface of the lower electrode layer 104 is a third distance c, where b>c, which is used to form a pit between the first protruding portion and the second protruding portion. The pit may effectively reduce a lateral mode parasitic resonance below a cutoff frequency, so as to further ensure that a bulk acoustic wave energy may be confined within a region surrounded by the first protruding portion 103 as much as possible. Here, the lower surface of the lower electrode layer 104 is the lower surface of the electrode body 107, and a piezoelectric effect region of the piezoelectric structure corresponds to a region 401 in FIG. 1, which is a portion located within the lower surface of the lower electrode layer 104 and the inner edge of the first protruding portions 103.

According to the embodiments of the present disclosure, the upper surface of the lower electrode layer 104 is a planarization surface. Specifically, a planarization process may be performed on the upper surface of the lower electrode layer 104, for example, a chemical mechanical polishing (CMP for short) process may be used to planarize the upper surface of the lower electrode layer 104 before the piezoelectric layer 105 is formed, that is, a planarization plane of the lower electrode layer may be formed. Therefore, the piezoelectric layer 105 of the piezoelectric structure may be grown on the upper surface of the flat lower electrode layer 104, which is more beneficial to acquire a crystal structure with a better growth texture and a high c-axis orientation between the piezoelectric layer 105 and the lower electrode layer 104, thereby improving a piezoelectric performance of the piezoelectric layer 105 and improving a performance (an improvement of Q value) of the solidly assembled resonator of the present disclosure.

According to the embodiments of the present disclosure, materials of the upper electrode layer 106 and the lower electrode layer 104 are combinations of one or more materials selected from molybdenum Mo, titanium Ti, tungsten W, gold Au, aluminum Al, platinum Pt, etc.; materials of the first protruding portion 103 and the second protruding portion 102 may be the same as the material of the lower electrode layer 104, so that a deposition and preparation of the lower electrode layer may be completed at one time. When a material selection of the protruding portion is inconsistent with a material selection of the electrode body 107 of the lower electrode layer 104, a preparation process of the lower electrode layer 104 needs to be adjusted accordingly. For example, molybdenum Mo may be selected as a preparation material of the lower electrode layer 104 (including the first protruding portion 103 and the second protruding portion 102) or the upper electrode layer 106. The materials of the above-mentioned upper electrode layer 106 and the lower electrode layer 104 may form a better bonding ability with the material of the below-mentioned piezoelectric layer 105, so that a crystal structure with a good growth texture and a high c-axis orientation may be acquired between the piezoelectric layer 105 and the lower electrode layer 104 or the upper electrode layer 106, thereby further improving a piezoelectric performance of the piezoelectric layer 105 and improving a performance (e.g., an improvement of Q value) of the solidly mounted resonator of the present disclosure.

The material of the piezoelectric layer 105 is aluminum nitride AlN, zinc oxide ZnO, lead zirconate titanate PZT, etc., and the material of the piezoelectric layer 105 may also be a combination of one or more materials selected from aluminum nitride AlN, zinc oxide ZnO, lead zirconate titanate PZT, etc. The material combinations of the above-mentioned various piezoelectric layers 105 may be directed to the piezoelectric layer 105 having a multi-layer structure, for example, AlN as the first layer, ZnO as the second layer, and PZT as the third layer together constitute the piezoelectric layer 105 of a three-layer structure. The material of the above-mentioned piezoelectric layer 105 may form a better bonding ability with the materials of the above-mentioned upper electrode layer 106 and lower electrode layer 104, so that a crystal structure with a good growth texture and a high c-axis orientation may be acquired between the piezoelectric layer 105 and the lower electrode layer 104 or the upper electrode layer 106, thereby further improving a piezoelectric performance of the piezoelectric layer 105 and improving a performance (e.g., an improvement of Q value) of the solidly mounted resonator of the present disclosure.

According to the embodiments of the present disclosure, as shown in FIG. 1, the solidly mounted resonator includes: a substrate layer 101 and a laminated structure 200. The substrate layer 101 is disposed below the piezoelectric structure and used to provide a formation basis for the piezoelectric structure, and functions as a substrate. The laminated structure 200 is disposed between the piezoelectric structure and the substrate layer 101, that is, the laminated structure 200 is disposed on the substrate layer 101, and the laminated structure 200 sequentially includes: a first low acoustic impedance layer 201, a first high acoustic impedance layer 202, a second low acoustic impedance layer 203, a second high acoustic impedance layer 204, and a third low acoustic impedance layer 205 from bottom to top, so as to form the Bragg reflective layer structure (i.e., the laminated structure 200) as shown in FIG. 1. The Bragg reflective layer structure is a sandwich-type sandwich structure formed by alternating low acoustic impedance material layer and high acoustic impedance material layer, so as to achieve a Bragg reflection effect on a bulk acoustic wave generated by the piezoelectric structure. The third low acoustic impedance layer 205 is disposed below the piezoelectric layer 105 of the piezoelectric structure, and is used to directly achieve a Bragg reflection effect on the bulk acoustic wave. At the same time, the third low acoustic impedance layer 205 may also provide a formation position for a formation of the lower electrode layer 104, and function as a support or a substrate for a formation of the piezoelectric structure.

According to the embodiments of the present disclosure, a material of the substrate layer 101 is a combination of one or more materials selected from silicon, glass, sapphire, ceramics, etc., for example, glass may be used as the substrate layer 101 to facilitate a better bonding ability produced with the first low acoustic impedance layer 201 formed on an upper surface of the substrate layer 101. Materials of the first low acoustic impedance layer 201, the second low acoustic impedance layer 203 and the third low acoustic impedance layer 205 are siloxane or silicon dioxide, so as to form a better low acoustic impedance performance and facilitate a formation of a Bragg reflector structure with a better performance; and materials of the first high acoustic impedance layer 202 and the second high acoustic impedance layer 204 are tungsten W or molybdenum Mo, so as to form a better high acoustic impedance performance and facilitate a formation of a Bragg reflector structure with a better performance.

According to the embodiments of the present disclosure, as shown in FIG. 1 and FIG. 2B, the third low acoustic impedance layer 205 includes: a lower electrode slot 301. The lower electrode slot 301 is recessed downward relative to an upper surface of the third low acoustic impedance layer 205. The lower electrode slot 301 includes: a first groove 303, a second groove 302 and a main body groove 304. The first groove 303 is recessed downward corresponding to an edge of a bottom surface of the lower electrode slot 301, and has a shape and size matching a shape and size of the first groove 303. The first groove 303 is a closed annular groove, and is used to correspondingly accommodate the first protruding portion 103. The second groove 302 is recessed downward corresponding to a middle portion of the bottom surface of the lower electrode slot 301, has a shape and size matching a shape and size of the first protruding portion 103, and is used to correspondingly accommodate the first protruding portion 103. A space as shown by an annular closed dashed line in FIG. 2B corresponds to a structure of the main body groove 304. The bottom surface of the lower electrode slot 301 may be a bottom surface of the main body groove 304, which corresponds to a top surface of the groove protrusion 305. The third low acoustic impedance layer 205 functions as Bragg reflection corresponding to the bottom surface of the lower electrode slot 301 in the region 401 as shown in FIG. 1 and FIG. 2B, and the bottom surface of the lower electrode slot 301 corresponding to the region 401 may include a bottom surface of the first groove 303 and a top surface of the groove protrusion 305. Therefore, a region that actually functions as Bragg reflection in the present disclosure corresponds to the laminated structure 200 as indicated by 200 in FIG. 1 and FIG. 4 to FIG. 11.

According to the embodiments of the present disclosure, as shown in FIG. 1 and FIG. 2B, the first groove 303 is used to match and accommodate the first protruding portion 103, which corresponds to the first protruding portion 103 shown in FIG. 2A, and then the first groove 303 is a closed annular slot, that is, a closed annular groove; corresponding to the first protruding portion 103 and the second protruding portion 102 as shown in FIG. 2A, a distance between an inner edge of the first groove 303 and an outer edge of the grooves 302 is a first distance a; a concave distance of the first groove 303 relative to the bottom surface of the lower electrode slot 301 is a second distance b; a concave distance of the second groove 302 relative to the bottom surface of the lower electrode slot 301 is a third distance c; wherein b>c, so that a groove protrusion 305 between the inner edge of the first groove 303 and the outer edge of the second groove 302 may be formed in the lower electrode slot 301 of the third low acoustic impedance layer 205. The groove protrusion 305 is a closed annular protrusion with a width dimension of a. The bottom surface of the first groove 303 is in contact with a top surface of the first protruding portion 103, and a sidewall surface of the first groove 303 is in contact with a sidewall surface of the first protruding portion 103; correspondingly, a bottom surface of the second groove 302 is in contact with a top surface of the second protruding portion 102, and a sidewall surface of the second groove 302 is in contact with a sidewall surface of the second protruding portion 102; in addition, the lower surface of the electrode body 107 of the lower electrode layer 104 is in contact with the top surface of the groove protrusion 305 is in contact with the top surface of the groove protrusion 305.

According to the embodiments of the present disclosure, as shown in FIG. 1 and FIG. 2B, the third low acoustic impedance layer 205 needs to maintain a certain thickness dimension to form the lower electrode slot 301 (including the first groove 303 and the second groove 302 and main body groove 304), so that the lower electrode layer 104 (including the corresponding first and second protruding portions 103 and 102 and the electrode body 107) may be accommodated therein in a matching manner. Therefore, a certain excess thickness may be pre-deposited when the uppermost layer structure (e.g., the third low acoustic impedance layer in the present disclosure) of the laminated structure 200 is deposited, so that a film thickness of the structural layer may be used to assist in etching the first groove 303 and the second groove 302 and the main body groove 304. The region that functions as Bragg reflection in the present disclosure actually corresponds to the laminated structure 200 as indicated by 200 in FIG. 1 and FIG. 4 to FIG. 11. That is, an actual effective functional layer (or region) of the third low acoustic impedance layer 205 is located between the upper surface of the second high acoustic impedance layer 204 and the lower surface of the lower electrode layer 103. Therefore, the third low acoustic impedance layer 205 is actually provided by matching and fitting the lower electrode slot 301 and the lower electrode layer 104, so that the piezoelectric structure may be embedded in the laminated structure 200, and the upper surface of the third low acoustic impedance layer 205 outside the lower electrode slot 301 may be actually in direct contact with the piezoelectric layer 105, so as to protect and seal the lower electrode layer 104. At the same time, the piezoelectric structure may also be supported and stabilized, and a leakage of a bulk acoustic wave energy may be prevented. Therefore, the structure of the solidly mounted resonator of the present disclosure may directly omit a thickness of the lower electrode layer 104 in the conventional structure, so as to reduce a device size; in addition, another unexpected effect may be produced: since the upper surface of the lower electrode layer 104 is a planarization surface, a contact between the lower electrode layer 104 and the piezoelectric layer 105 may be a crystal contact with a better growth texture and a high c-axis orientation, resulting in a more stable bonding of the lower electrode layer 104 and the piezoelectric layer 105. Therefore, under a limitation of the lower electrode slot 301, the piezoelectric structure may be more stably combined with the laminated structure, which may not easily cause a phenomenon of structural separation during a production and preparation process, and may also be very helpful to improve an overall performance of the device.

According to the embodiments of the present disclosure, a reserved thickness of the third low acoustic impedance layer 205 is a sum of a thickness (e.g., a thickness of the second protruding portion 102) of the protruding portion of the lower electrode layer 104, a thickness of the electrode body 107 of the lower electrode layer 104, a thickness required for performing a planarization process after the lower electrode layer 104 is deposited in the lower electrode slot 301. Specifically, the specific thickness may be calculated according to a required frequency of the solidly mounted resonator. It should be noted that, since an effective region of the piezoelectric structure or the Bragg reflection structure is the region 401 shown in FIG. 1 and FIG. 2B, the reserved thickness may not include a thickness of the first protruding portion 103 of the lower electrode layer.

The present disclosure provides a solidly mounted resonator, including: a piezoelectric structure, wherein the piezoelectric structure includes: an upper electrode layer, a lower electrode layer and a piezoelectric layer. The lower electrode layer is disposed corresponding to a lower portion of the piezoelectric structure, and the lower electrode layer includes: a protruding portion protruding downward corresponding to a lower surface of the lower electrode layer; the piezoelectric layer is disposed on an upper surface of the lower electrode layer; and the upper electrode layer is disposed on an upper surface of the piezoelectric layer. The protruding portion is correspondingly formed on the lower surface of the lower electrode layer, so that the upper surface of the lower electrode layer in contact with the piezoelectric layer may form a planarization surface. Therefore, the piezoelectric layer is grown on a flat surface, and a crystal structure with a good growth texture and a high c-axis orientation is acquired more easily, so as to improve a piezoelectric performance of the piezoelectric layer and enhance a performance (e.g., an improvement of Q value) of the resonator.

Figure 3:
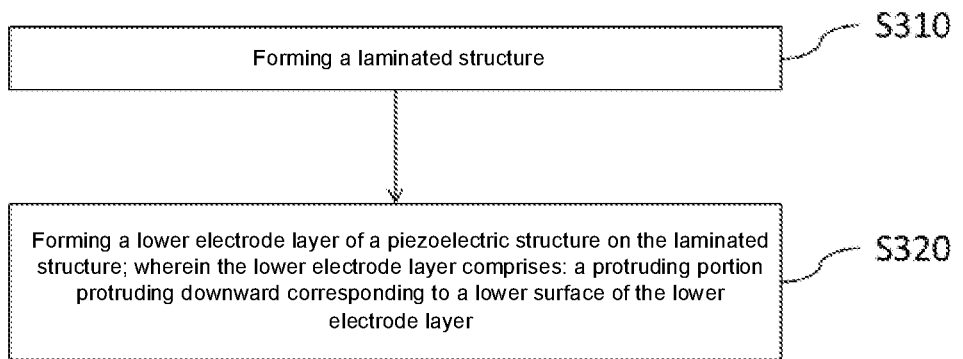
FIG. 3 schematically shows a flow chart of a method for preparing a solidly mounted resonator according to the embodiments of the present disclosure.

Another aspect of the present disclosure provides a method for preparing the above-mentioned solidly mounted resonator, as shown in FIG. 3, including:

S310 of forming the laminated structure 200, and

S320 of forming the lower electrode layer 104 of a piezoelectric structure on the laminated structure 200; wherein the lower electrode layer 104 includes: a protruding portion protruding downward corresponding to a lower surface of the lower electrode layer 104.

In the method for preparing a solidly mounted resonator of the present disclosure, by forming the lower electrode pattern (corresponding to the protruding portion) on the lower surface of the lower electrode layer 104, the above-mentioned pattern is not necessarily formed on the upper surface of the lower electrode layer 104, the upper surface (i.e., the upper surface of the electrode body 107, as shown in FIG. 2A) of the lower electrode layer 104 may form a flat surface, the piezoelectric layer 105 of the piezoelectric structure may be grown on the upper surface of the flat lower electrode layer 104, which is more beneficial to acquire a crystal structure with a good growth texture and a high c-axis orientation between the piezoelectric layer 105 and the lower electrode layer 104, thereby improving a piezoelectric performance of the piezoelectric layer 105 and improving a performance (an improvement of Q value) of the solidly mounted resonator of the present disclosure.

In addition, based on the above-mentioned preparation method, the present disclosure may produce an unexpected technical effect: a patterned structure protruding portion of the lower electrode layer 104 of the present disclosure may be formed by a metal deposition method. Compared with a conventional method of directly forming a protruding portion on the upper surface of the lower electrode layer 104 or the upper surface of the upper electrode 106 by a metal etching method, the above-mentioned method may not only prevent a problem of metal over-etching during a preparation process and effectively improve a preparation yield of the device, but also avoid multiple etchings and reduce formation steps of the protruding portion of the lower electrode layer, so that the preparation process may be simplified, and a thickness variation of the lower electrode layer may be effectively controlled during the preparation process.

Regarding the structure of the resonator, please refer to the solidly mounted resonator shown in FIG. 1 to FIG. 2B, which will not be repeated here.

Figure 4:
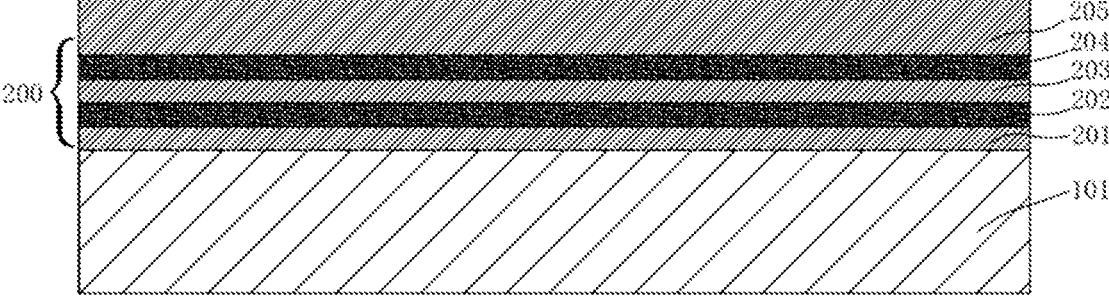
FIG. 4 schematically shows a structural cross-sectional view of a preparation stage of a method for preparing a solidly mounted resonator according to the embodiments of the present disclosure.

According to the embodiments of the present disclosure, the forming the laminated structure 200 includes: sequentially forming a first low acoustic impedance layer 201, a first high acoustic impedance layer 202, a second low acoustic impedance layer 203, a second high acoustic impedance layers 204 and a third low acoustic impedance layer 205 on the substrate layer 101 from bottom to top. Specifically, the laminated structure 200 is formed on an upper surface of the substrate layer 101 as a Bragg reflective layer structure of the solidly mounted resonator of the present disclosure. A low acoustic impedance layer and a high acoustic impedance layer are alternately deposited on the upper surface of the substrate 101 to form a Bragg reflective layer structure. Specifically, the first high acoustic impedance layer 202 may be deposited first, then the first high acoustic impedance layer 202 may be deposited on an upper surface of the first low acoustic impedance layer 201, the second low acoustic impedance layer 203 may be deposited on the first high acoustic impedance layer 202, the second high acoustic impedance layer 204 may be deposited on an upper surface of the second low acoustic impedance layer 203, and the third low acoustic impedance layer 205 may be deposited on an upper surface of the second high acoustic impedance layer 204, as shown in FIG. 4. When the third low acoustic impedance layer 205 is prepared and deposited, a thickness that needs to be removed when a planarization process is performed on the upper surfaces of the lower electrode layer 104 and structures (e.g., the first groove 303, the second groove 302, and the main body groove 304) in the lower electrode slot 301 shown in FIG. 1 and FIG. 2B may be reserved.

Figure 5A:
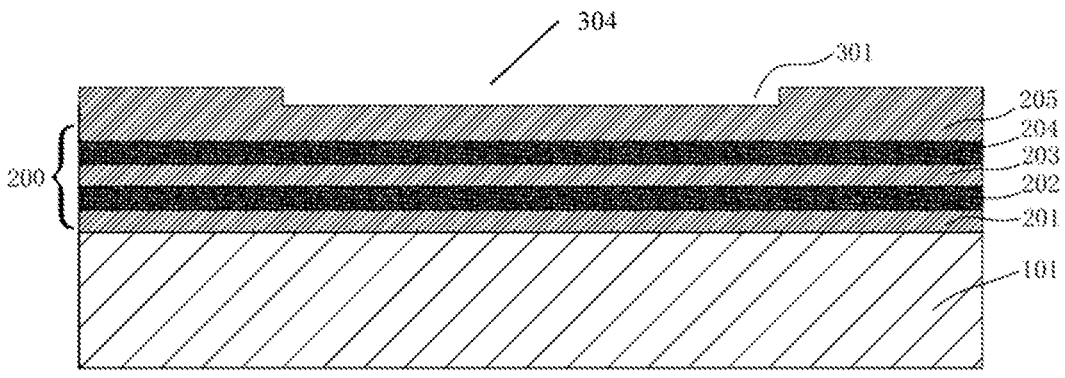
FIG. 5A schematically shows a structural cross-sectional view of another preparation stage of a method for preparing a solidly mounted resonator according to the embodiments of the present disclosure.
Figure 5B:
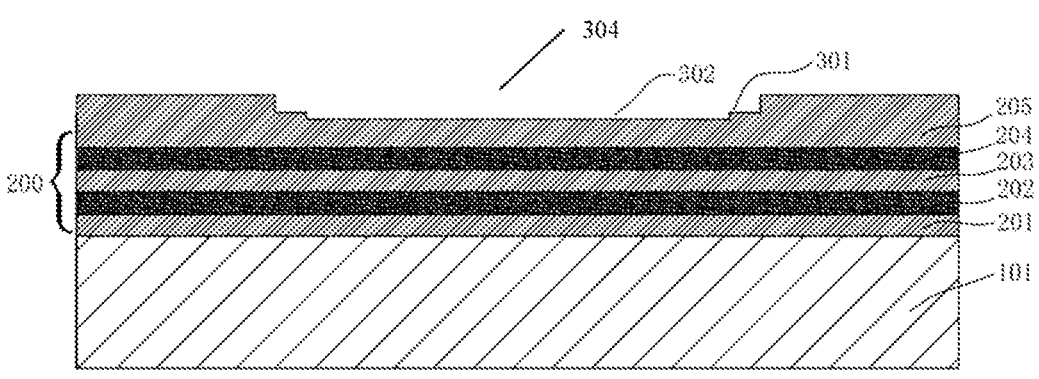
FIG. 5B schematically shows a structural cross-sectional view of another preparation stage of a method for preparing a solidly mounted resonator according to the embodiments of the present disclosure.
Figure 5C:
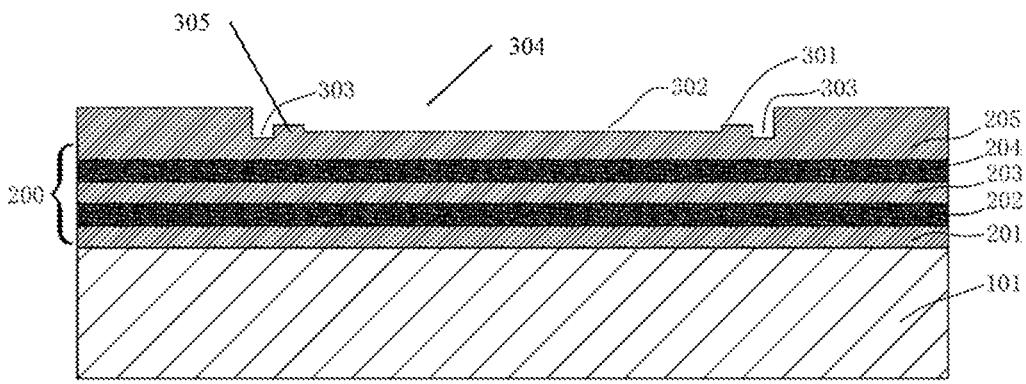
FIG. 5C schematically shows a structural cross-sectional view of another preparation stage of a method for preparing a solidly mounted resonator according to the embodiments of the present disclosure.

According to the embodiments of the present disclosure, the forming a piezoelectric structure on the laminated structure 200 includes: forming a lower electrode slot 301 recessed downward on an upper surface of the third low acoustic impedance layer 205; a first groove 303 recessed downward is formed corresponding to an edge of a bottom surface of of the lower electrode slot 301; a second groove 302 recessed downward is formed corresponding to a middle portion of the bottom surface of the lower electrode slot 301, as shown in FIG. 5A to FIG. 5C. Specifically, the lower electrode slot 301 may be formed by etching downward on the upper surface of the third low acoustic impedance layer 205 by dry etching or wet etching. For example, the etching process may specifically use a dry etching process, so as to form more ideal depths (as shown in FIG. 2B) of the main body groove 304 of the lower electrode slot 301 and the first groove 303 and the second groove 302 by better controlling an etching rate. The main body groove 304 needs to be etched first, as shown in FIG. 5A; then the second groove 302 is formed by etching downward in a middle portion of an inner surface of the main body groove 304, as shown in FIG. 5B; the first groove 303 is formed by etching downward on an edge of the inner surface of the main body groove 304, and at the same time, the groove protrusion 305 shown in FIG. 2B may be formed, as shown in FIG. 5C. Specifically, a first photoresist (PR for short) layer is first formed on the upper surface of the third low acoustic impedance layer 205, and a photolithography is performed on the formed first photoresist layer corresponding to a position of the lower electrode layer 104 and the upper surface of the third low acoustic impedance layer 205, so as to form the main body groove 304 recessed in the upper surface of the third low acoustic impedance layer 205, as shown in FIG. 5A. Based on a formation of the inner surface of the main body groove 304, a second photoresist layer may be further formed, and a photolithography is performed on the formed second photoresist layer corresponding to a position of the second protruding portion 102 and a middle portion of the bottom surface of the main body groove 304, so as to form the second groove 302 recessed in the bottom surface of the main body groove 304, as shown in FIG. 5B. Based on a formation of an inner surface of the second groove 302, a third photoresist layer may continue to be formed, and a photolithography is performed on the formed third photoresist layer corresponding to a position of the first protruding portion 103 and an edge of the bottom surface of the main body groove 304, so as to form the first groove 303 recessed in the bottom surface of the main body groove 304, as shown in FIG. 5C.

Since the first groove 303 has the largest depth relative to the upper surface of the third low acoustic impedance layer 205, the above-mentioned process may also be adjusted to form the second groove 302 first, then form the main body groove 304, and finally form the first groove 303. The above-mentioned photolithography process may well control an etched depth of the third low acoustic impedance layer 205 according to an etching rate and an etching time. In addition, compared with a conventional method of forming an electrical electrode pattern on the upper surface of the lower electrode layer, the method of etching the third low acoustic impedance layer 205 (made of siloxane or silicon dioxide, etc.) to form the lower electrode slot 301 may avoid an etching of a metal electrode with a poor etching selection, may achieve a precise control of a etching rate more easily, and may further prevent the metal electrode from being over-etched in an etching process. The process of forming the lower electrode layer 104 is very simple.

Figure 6:
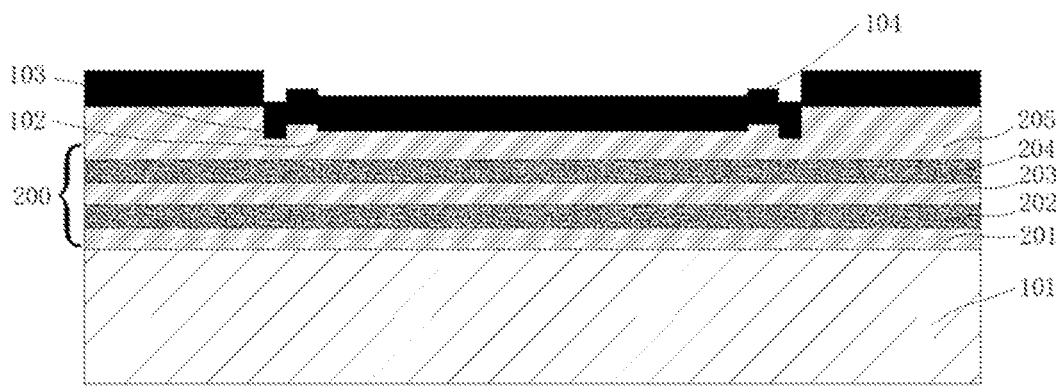
FIG. 6 schematically shows a structural cross-sectional view of another preparation stage of a method for preparing a solidly mounted resonator according to the embodiments of the present disclosure.

According to the embodiments of the present disclosure, based on the laminated structure, the forming the lower electrode layer 104 corresponding to the lower portion of the piezoelectric structure includes: forming the lower electrode layer 104 in the lower electrode slot 301 based on the first groove 303, the second groove 302 and the main body groove 304; the first protruding portion 103 of the protruding portion is formed corresponding to the first groove 303; the second protruding portion 102 of the protruding portion is formed corresponding to the second groove 302; the electrode body 107 of the lower electrode layer 104 is formed corresponding to the main body groove 304. After the lower electrode slot 301 is formed, an electrode material may be deposited therein to form the lower electrode layer 104. It should be noted that a thickness of the deposited electrode material is significantly higher than a depth of the lower electrode slot 301, and may be significantly protruded outside an opening of the main body groove 304, so as to ensure that the lower electrode slot 301 may be completely filled, which is beneficial for the next step to perform a planarization process on the upper surface of the lower electrode layer 104 without affecting predetermined thicknesses of the lower electrode layer 104 and the third low acoustic impedance layer 205, as shown in FIG. 6. The deposition process of the present disclosure may be a physical vapor deposition (PVD for short) or chemical vapor deposition (CVD for short), for example, a deposition process of molybdenum Mo as a material of the lower electrode layer.

According to the embodiments of the present disclosure, the forming a piezoelectric structure on the laminated structure 200 includes:

performing a planarization process on the lower electrode layer 104 and the third low acoustic impedance layer 205, wherein the upper surface of the lower electrode layer 104 is a planarization surface, and the planarization surface is flush with the upper surface of the third low acoustic impedance layer 205. Specifically, as shown in FIG. 6, under a condition of ensuring that the lower electrode slot 301 is completely filled, an upper surface of the structure is actually uneven. Therefore, a planarization process needs to be performed on the upper surface of the structure. For example, a chemical mechanical polishing (CMP for short) process is used to planarize the upper surface of the lower electrode layer 104, that is, a planarization plane of the lower electrode layer may be formed.

Figure 7:
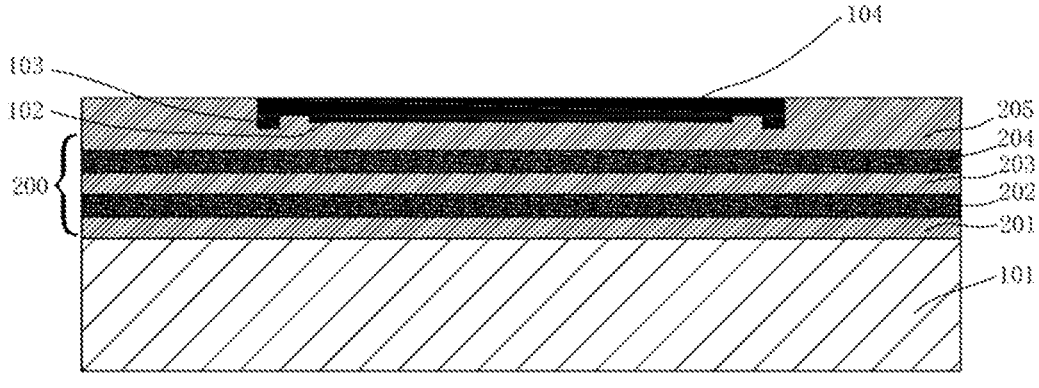
FIG. 7 schematically shows a structural cross-sectional view of another preparation stage of a method for preparing a solidly mounted resonator according to the embodiments of the present disclosure.

In the embodiments of the present disclosure, the CMP process may not only polish and grind a deposited metal material of the lower electrode layer 104, but also simultaneously polish and grind a material (e.g., silicon dioxide) of the third low acoustic impedance layer 205. In addition, the CMP process may precisely control a polishing thickness by controlling a polishing rate, so as to precisely control thicknesses of the first protruding portion 103, the second protruding portion 102 and the electrode body 107 corresponding to the lower electrode layer 104. Specifically, the planarization process first removes an excess electrode material on the upper surface of the deposited lower electrode layer 104, so that the upper surface of the lower electrode layer 104 may be flush with the upper surface of the third low acoustic impedance layer 205. Through the planarization process, a specific thickness of the electrode material to be removed may be determined according to a thickness of the electrode material protruding outside the opening of the main body groove 304 and a value measured on the line. After that, a planarization process may continue to be performed on the upper surface of the third low acoustic impedance layer 205 and the upper surface of the polished lower electrode layer 104 until an upper surface of an entire structure is planarized (that is, a planarization surface of the lower electrode layer 104 is acquired), while ensuring thicknesses of the first protruding portion 103, the second protruding portion 102 and the electrode body 107 corresponding to the lower electrode layer 104, as shown in FIG. 7.

Figure 8:
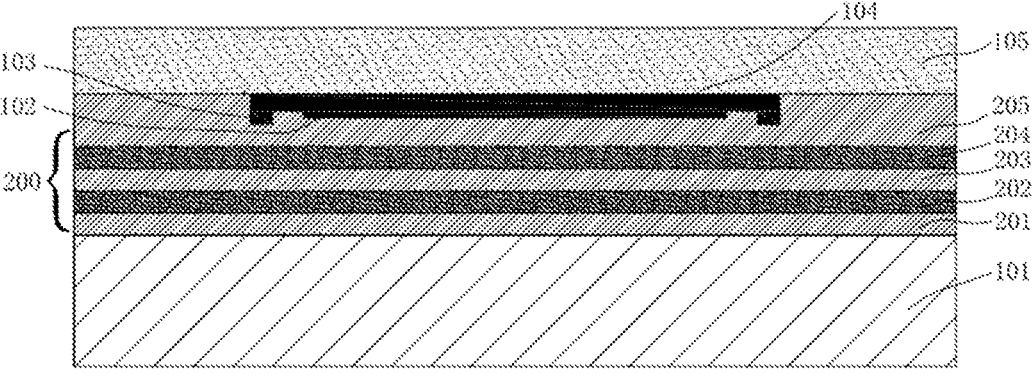
FIG. 8 schematically shows a structural cross-sectional view of another preparation stage of a method for preparing a solidly mounted resonator according to the embodiments of the present disclosure.

According to the embodiments of the present disclosure, the preparation method further includes: forming a piezoelectric layer of the piezoelectric structure corresponding to the planarization surface of the lower electrode layer 104 and the upper surface of the third low acoustic impedance layer 205; the piezoelectric layer 105 may be deposited and formed by, for example, a PVD process or a CVD process, on the upper surface of the lower electrode layer 104 and the upper surface of the third low acoustic impedance layer 205 that have undergone the planarization process, so that a peripheral region of the lower surface of the piezoelectric layer 105 is in contact with the upper surface of the third low acoustic impedance layer 205, and a middle region of the piezoelectric layer 105 is in contact with the upper surface of the lower electrode layer 104, as shown in FIG. 8.

Therefore, the piezoelectric layer 105 of the piezoelectric structure may be grown on the upper surface of the flat lower electrode layer 104, which is more beneficial to acquire a crystal structure with a better growth texture and a high c-axis orientation between the piezoelectric layer 105 and the lower electrode layer 104, thereby improving a piezoelectric performance of the piezoelectric layer 105, and improving a performance (an improvement of Q value) of the solidly mounted resonator of the present disclosure. For example, a material used in the piezoelectric layer 105 may be AlN, which is formed on a flat surface. When in contact with the upper surface of the lower electrode layer 104, AlN has a better C-axis crystal orientation, which may significantly improve a piezoelectric effect and further improve an overall performance of the device.

Figure 9:
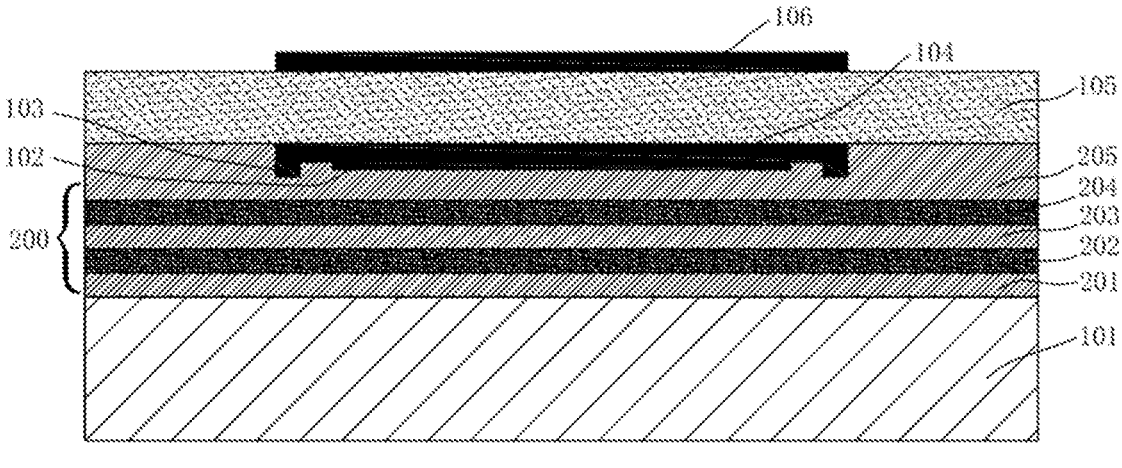
FIG. 9 schematically shows a structural cross-sectional view of another preparation stage of a method for preparing a solidly mounted resonator according to the embodiments of the present disclosure.

According to the embodiments of the present disclosure, the preparation method further includes: forming the upper electrode layer 106 of the piezoelectric structure on the upper surface of the piezoelectric layer 105, as shown in FIG. 9. The upper electrode layer 106 may be formed by, for example, a PVD process or a CVD process, and a material of the upper electrode layer 106 may be the same as a material of the lower electrode layer 104. Finally, a photolithography is performed on the upper electrode layer 106 to form a predetermined pattern of the upper electrode layer 106, that is, an external pattern structure of the solidly mounted resonator.

The above-mentioned specific embodiments have described in detail the objectives, technical solutions and advantages of the present disclosure. It should be noted that the above are only specific embodiments of the present disclosure and are not intended to limit the present disclosure. Any modifications, equivalent substitutions, improvements, and the like made within the spirit and scope of the present disclosure shall be included in the scope of protection of the present disclosure.

What is claimed is:

1. A solidly mounted resonator, comprising:
a piezoelectric structure, wherein the piezoelectric structure comprises:
a lower electrode layer disposed corresponding to a lower portion of the piezoelectric structure, wherein the lower electrode layer comprises:
a protruding portion protruding downward corresponding to a lower surface of the lower electrode layer;
a piezoelectric layer disposed on an upper surface of the lower electrode layer;
an upper electrode layer disposed on an upper surface of the piezoelectric layer,
a substrate layer disposed below the piezoelectric structure, and
a laminated structure disposed between the piezoelectric structure and the substrate layer, wherein the laminated structure sequentially comprises: a first low acoustic impedance layer, a first high acoustic impedance layer, a second low acoustic impedance layer, a second high acoustic impedance layer, and a third low acoustic impedance layer from bottom to top, wherein the third low acoustic impedance layer is disposed below the piezoelectric layer of the piezoelectric structure,
wherein the third low acoustic impedance layer comprises:
a lower electrode slot recessed downward relative to an upper surface of the third low acoustic impedance layer, wherein the lower electrode slot comprises:
a first groove recessed downward corresponding to an edge of a bottom surface of the lower electrode slot; and a second groove recessed downward corresponding to a middle portion of the bottom surface of the lower electrode slot.

2. The solidly mounted resonator according to claim 1, wherein the protruding portion comprises:
a first protruding portion protruding downward corresponding to an edge of the lower surface of the lower electrode layer; and
a second protruding portion protruding downward corresponding to a middle portion of the lower surface of the lower electrode layer.

3. The solidly mounted resonator according to claim 2, wherein the first protruding portion is an annular closed structure;
wherein a distance between an inner edge of the first protruding portion and an outer edge of the second protruding portion is a first distance a; a protruding distance of the first protruding portion relative to the lower surface of the lower electrode layer is a second distance b; a protruding distance of the second protruding portion relative to the lower surface of the lower electrode layer is a third distance c; wherein b>c.

4. The solidly mounted resonator according to claim 1, wherein,
the upper surface of the lower electrode layer is a planarization surface;
materials of the upper electrode layer and the lower electrode layer are combinations of one or more materials selected from molybdenum (Mo), titanium (Ti), tungsten (W), gold (Au), aluminum (Al), and platinum (Pt); and
a material of the piezoelectric layer is aluminum nitride (AlN), zinc oxide (ZnO) or lead zirconate titanate (PZT).

5. The solidly mounted resonator according to claim 1, wherein the first groove is a closed annular slot; wherein a distance between an inner edge of the first groove and an outer edge of the second groove is a first distance a; a concave distance of the first groove relative to the bottom surface of the lower electrode slot is a second distance b; a concave distance of the second groove relative to the bottom surface of the lower electrode slot is a third distance c; wherein b>c.

6. The solidly mounted resonator according to claim 1, wherein
a material of the substrate layer is a combination of one or more materials selected from silicon, glass, sapphire, and ceramics;
materials of the first low acoustic impedance layer, the second low acoustic impedance layer and the third low acoustic impedance layer are siloxane or silicon dioxide; and
materials of the first high acoustic impedance layer and the second high acoustic impedance layer are tungsten or molybdenum.

* * * * *